(12) United States Patent
Chou et al.

(10) Patent No.: US 11,764,094 B2
(45) Date of Patent: Sep. 19, 2023

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Chung-Pin Chou, Hsinchu (TW); Kai-Lin Chuang, Chia-Yi (TW); Sheng-Wen Huang, Taichung (TW); Yan-Cheng Chen, Taichung (TW); Jun Xiu Liu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 23 days.

(21) Appl. No.: 17/651,690

(22) Filed: Feb. 18, 2022

(65) Prior Publication Data
US 2023/0268215 A1    Aug. 24, 2023

(51) Int. Cl.
*H01T 23/00*     (2006.01)
*H01L 21/683*    (2006.01)

(52) U.S. Cl.
CPC .................. *H01L 21/6833* (2013.01)

(58) Field of Classification Search
None
See application file for complete search history.

(56) References Cited

U.S. PATENT DOCUMENTS

| | | | |
|---|---|---|---|
| 6,215,640 B1* | 4/2001 | Hausmann | H01L 21/6833 361/115 |
| 7,292,428 B2 | 11/2007 | Hanawa et al. | |
| 10,904,996 B2 | 1/2021 | Koh et al. | |
| 2003/0010338 A1* | 1/2003 | Nilsson | A61M 15/025 128/203.15 |
| 2010/0271744 A1 | 10/2010 | Ni et al. | |
| 2012/0126118 A1* | 5/2012 | Suzuki | H01J 37/026 250/310 |
| 2012/0235036 A1* | 9/2012 | Hatakeyama | H01J 37/20 250/310 |
| 2020/0312636 A1* | 10/2020 | Kawawa | H01L 21/67253 |

FOREIGN PATENT DOCUMENTS

| | | |
|---|---|---|
| CN | 101189772 B | 7/2011 |
| JP | 2002134601 A | 5/2002 |
| TW | 201826389 A | 7/2018 |
| TW | 201923948 A | 6/2019 |

* cited by examiner

*Primary Examiner* — Stephen W Jackson
(74) *Attorney, Agent, or Firm* — Harrity & Harrity, LLP

(57) ABSTRACT

Some implementations described herein provide techniques and apparatuses for a semiconductor processing tool including an electrostatic chuck having a voltage-regulation system to regulate an electrical potential throughout regions of a semiconductor substrate positioned above the electrostatic chuck. The voltage-regulation system may determine that an electrical potential within a region of the semiconductor substrate does not satisfy a threshold. The voltage-regulation system may, based on determining that the electrical potential throughout the region does not satisfy the threshold, position one or more electrically-conductive pins within the region. While positioned within the region, the one or more electrically-conductive pins may change the electrical potential of the region.

20 Claims, 16 Drawing Sheets

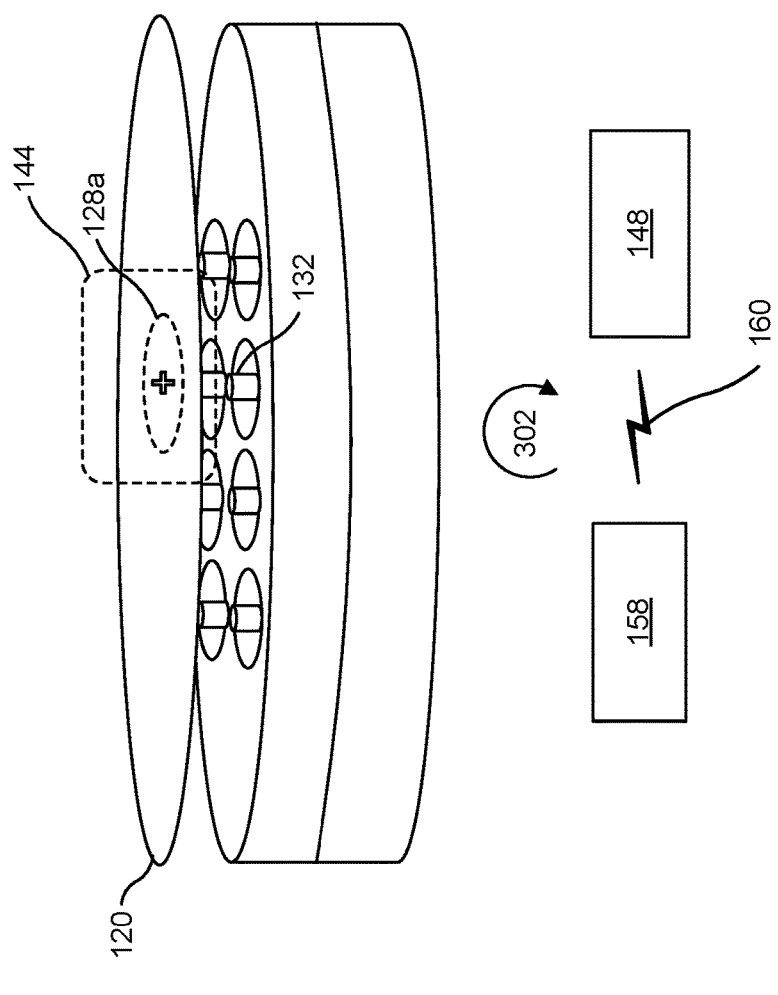

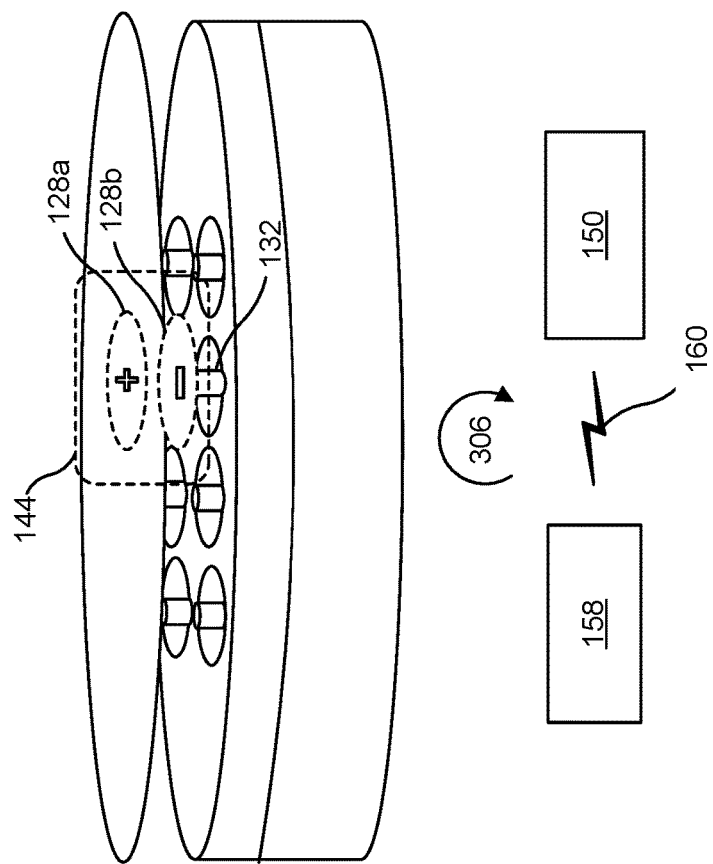

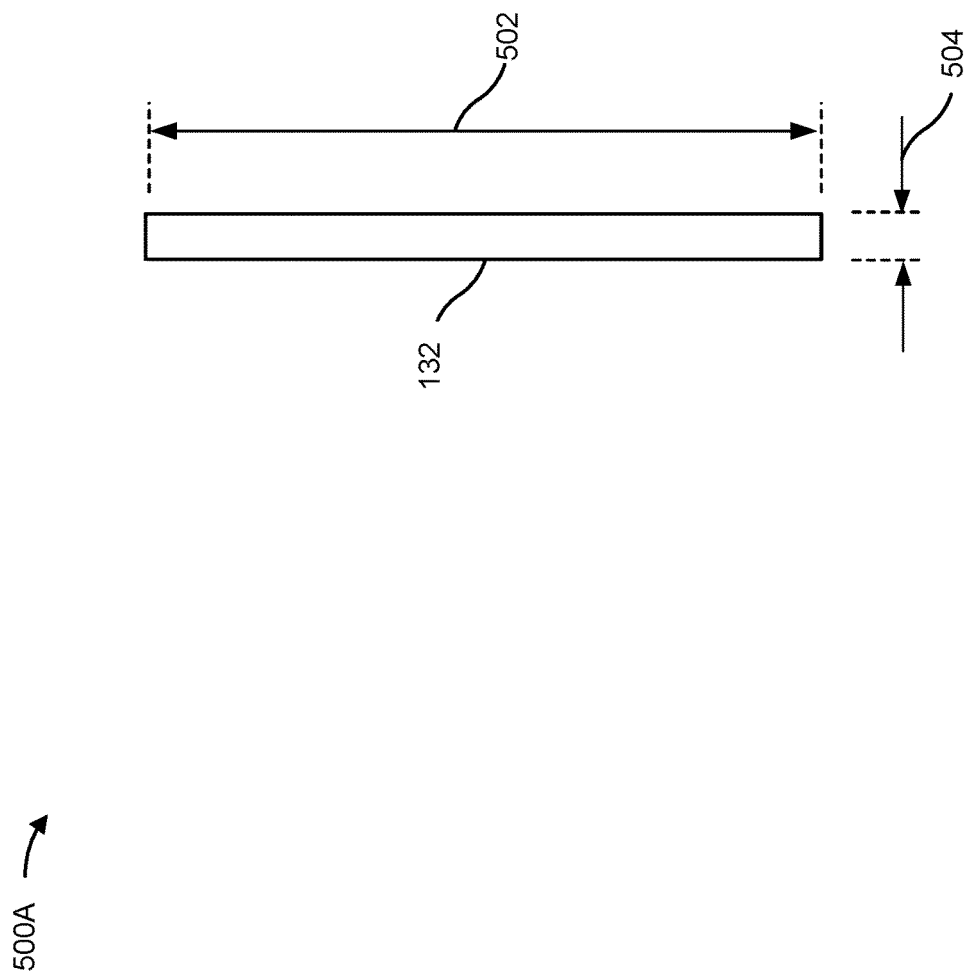

SEMICONDUCTOR PROCESSING TOOL AND METHODS OF OPERATION

BACKGROUND

A semiconductor processing tool may include an electrostatic chuck (ESC) that supports a semiconductor substrate for processing. For example, a scanning electron microscope (SEM) may include an ESC that temporarily capture and position the semiconductor substrate above the ESC for inspection. While the semiconductor substrate is temporarily supported above the ESC, one or more electron beams of the SEM may scan the semiconductor substrate for defects such as contamination, a bridging of a material, or an incorrect feature size, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C and 4A-4C are diagrams of example implementations of the voltage-regulation system described herein.

FIGS. 5A, 5B, and 6 are diagrams of example implementations of electrically-conductive pins described herein.

DETAILED DESCRIPTION

Figure 1A:
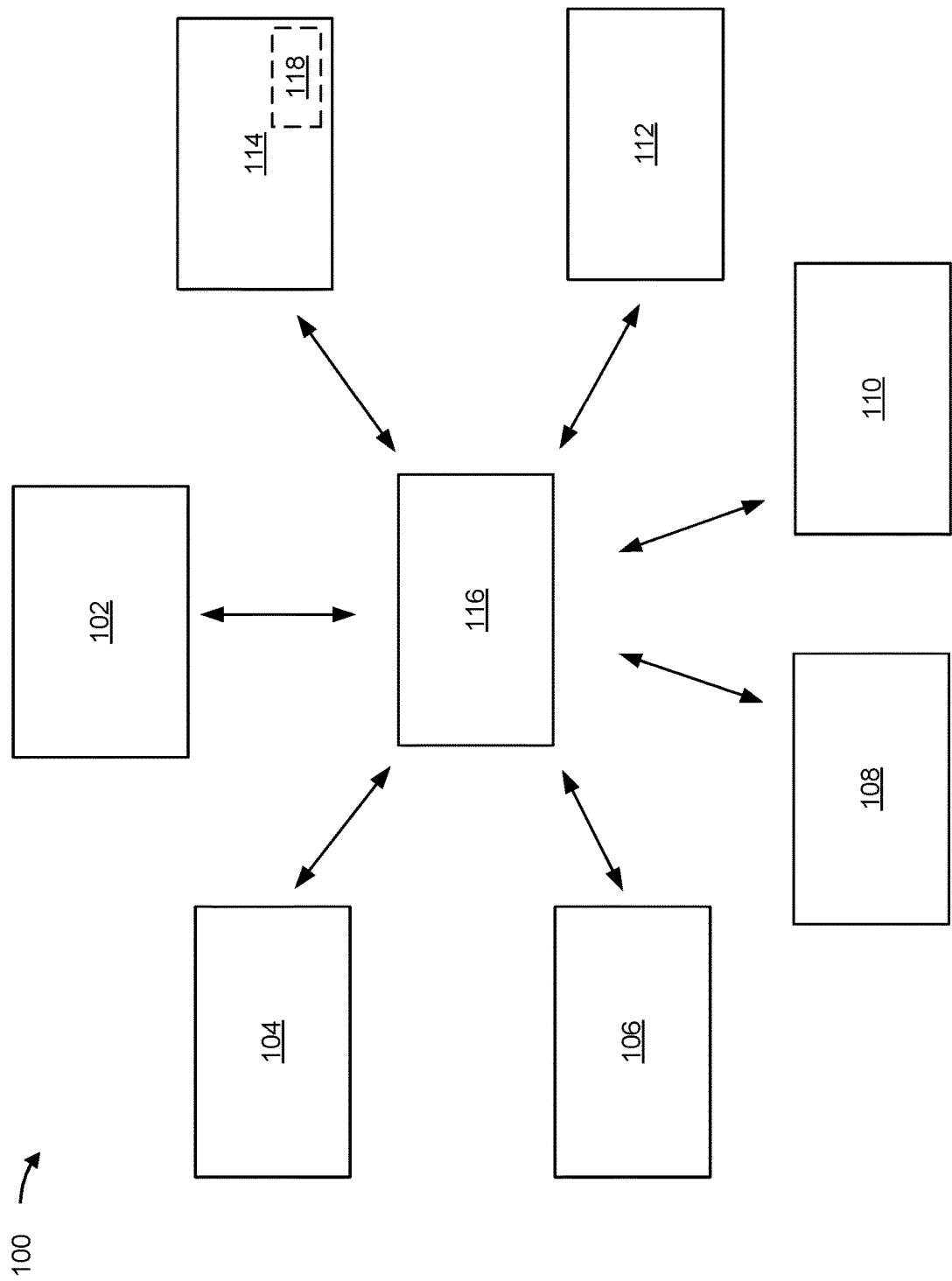
FIGS. 1A-1C are diagrams of an example environment in which a voltage-regulation system and related methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An electrostatic chuck (ESC) of a semiconductor processing tool may support a semiconductor substrate. While the semiconductor substrate is supported by the ESC, an electrical potential (e.g., an amount of an electrical charge) may form in a region of the semiconductor substrate. The electrical potential may cause electrical arcing between the semiconductor substrate and a component of the semiconductor processing tool. Additionally, or alternatively, the electrical potential may cause electrical arcing between the semiconductor substrate and an electrical ground of the semiconductor processing tool.

Electrical arcing may cause damage to the semiconductor substrate and may reduce a yield of semiconductor devices manufactured from the semiconductor substrate. Electrical arcing may also damage the semiconductor processing tool, which may result in increased downtime of the semiconductor processing tool and/or reduced throughput of semiconductor devices manufactured using the semiconductor processing tool.

Some implementations described herein provide a semiconductor processing tool that includes an ESC and a voltage-regulation system. The voltage-regulation system is configured to regulate an electrical potential throughout regions of a semiconductor substrate supported by the ESC. The voltage-regulation system may determine that an electrical potential (e.g., an amount of an electrical charge) within a region of the semiconductor substrate does not satisfy a threshold. The voltage-regulation system may position, based on determining that the electrical potential within the region does not satisfy the threshold, one or more electrically-conductive pins within the region. The one or more electrically-conductive pins may change the electrical potential of the region while positioned within the region. In some implementations, the voltage regulation system positions the one or more electrically-conductive pins using different ranges of vertical motion to accommodate a degree of warpage of the semiconductor substrate.

In this way, the voltage-regulation system ensures that the electrical potential of the region satisfies the threshold. By ensuring that the electrical potential satisfies the threshold, the voltage regulation system may reduce a likelihood of electrical arcing between the semiconductor substrate and a component of the semiconductor processing tool. Accordingly, the voltage-regulation system prevents and/or reduces a likelihood of damage to the semiconductor substrate, which increases a yield of semiconductor devices fabricated from the semiconductor substrate. Furthermore, the voltage-regulation system prevents and/or reduces a likelihood of damage to the semiconductor processing tool, which increases an uptime of the semiconductor processing tool and increases a throughput of semiconductor devices manufactured using the semiconductor processing tool.

Figure 1B:
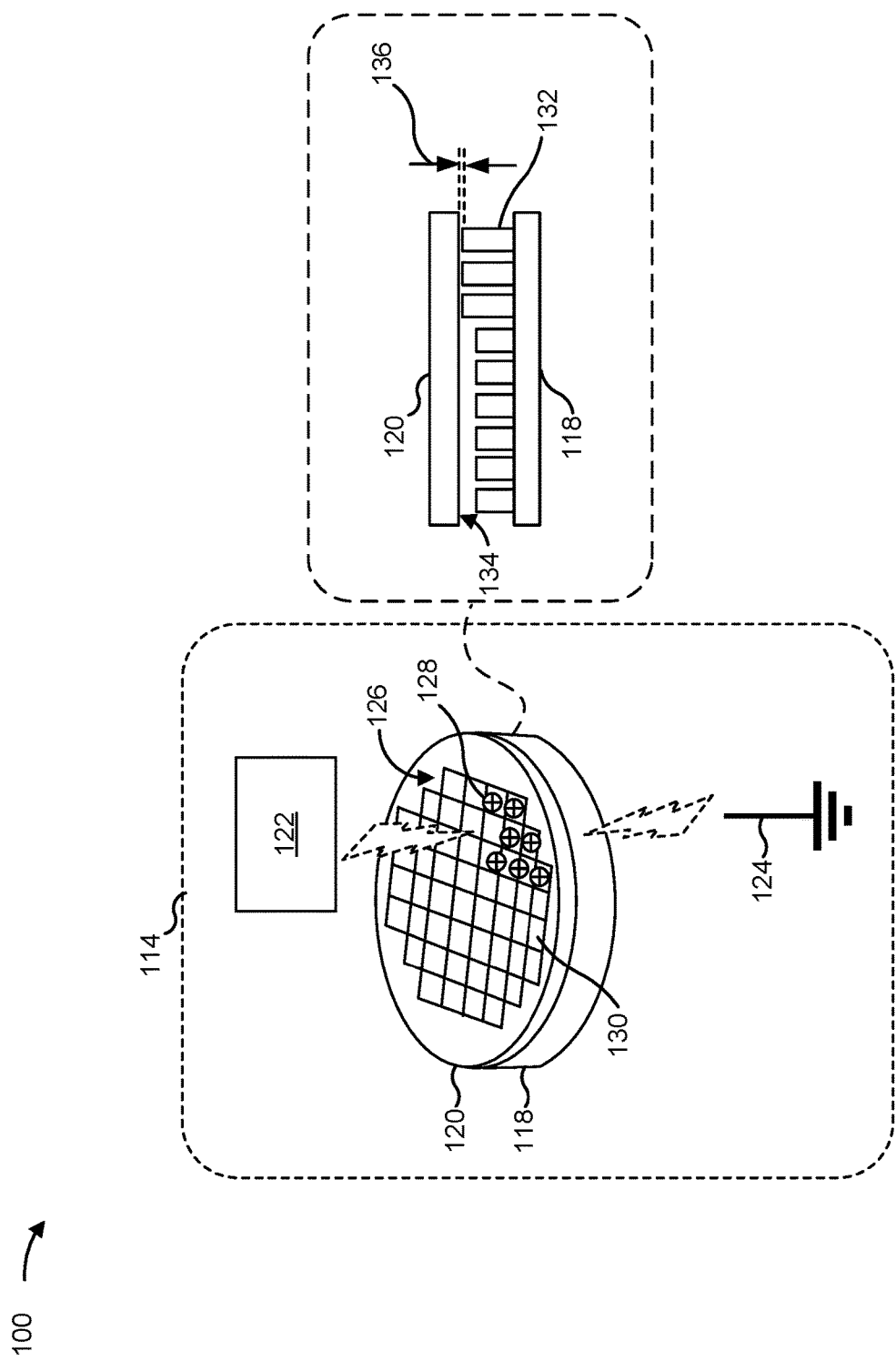
Figure 1C:
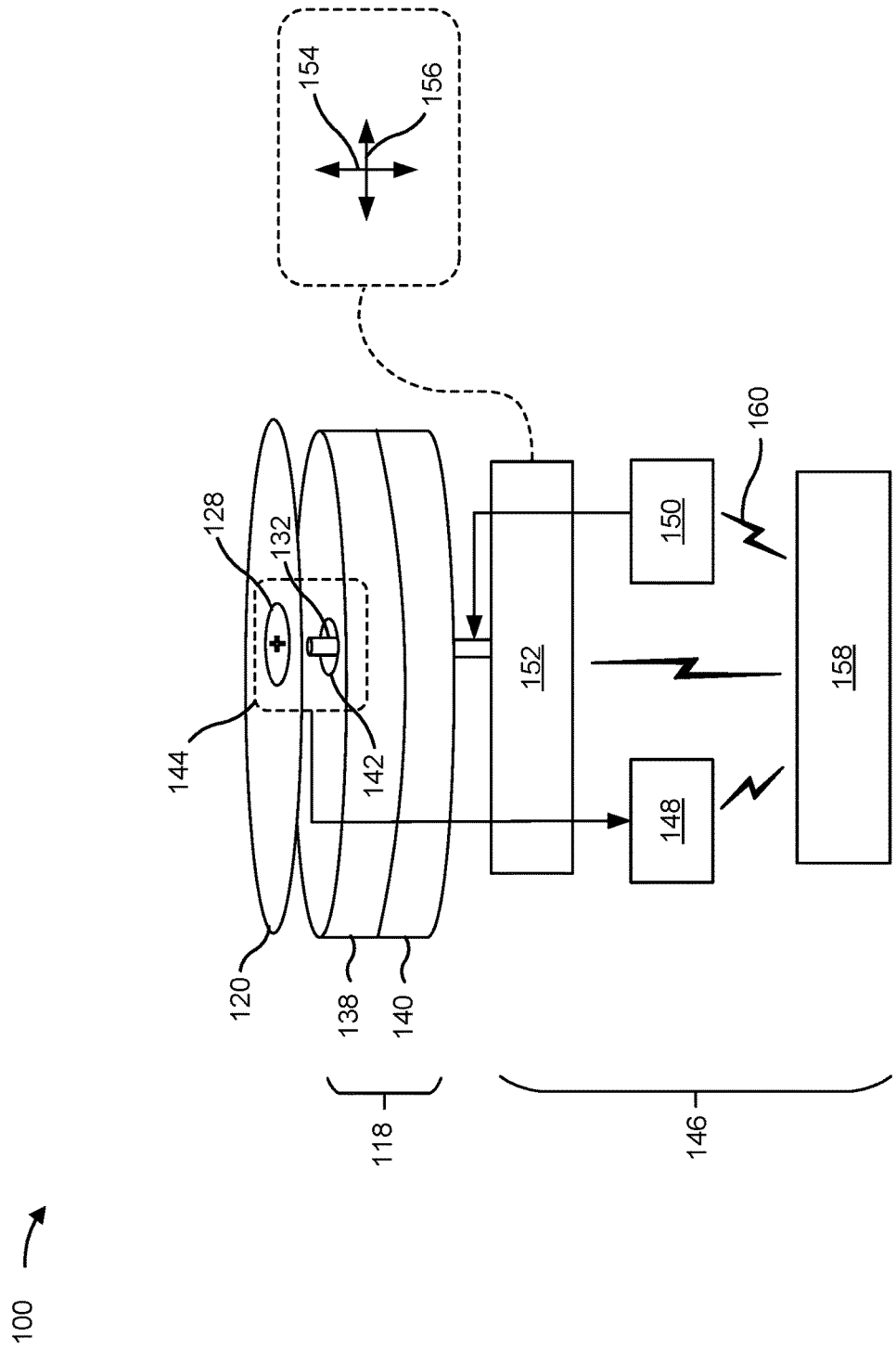

FIGS. 1A-1C are diagrams of an example environment 100 in which a voltage-regulation system and related methods described herein may be implemented. As shown in FIG. 1A, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an inspection tool 114, and/or another type of semiconductor processing tool. The semiconductor processing tools 102-114 included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a semiconductor substrate (e.g., a semiconductor wafer). In some implementations, the deposition tool 102 includes a spin coating tool that is capable of depositing a photoresist layer on the semiconductor substrate. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a semiconductor substrate or a semiconductor device. For example, the etch tool 108 may include a wet etch tool, a dry etch tool, and/or the like. In some implementations, the etch tool 108 includes a chamber that is filled with an etchant, and the semiconductor substrate is placed in the chamber for a particular time period to remove particular amounts of one or more portions of the semiconductor substrate. In some implementations, the etch tool 108 may etch one or more portions of the semiconductor substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a semiconductor substrate or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a semiconductor substrate (e.g., a semiconductor wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The inspection tool 114 is a semiconductor processing tool that is capable of inspecting the semiconductor substrate for defects. Defects that the inspection tool 114 may detect include contamination, a bridging of a material, an incorrect feature size (e.g., an incorrect critical dimension) of integrated circuitry formed on the semiconductor substrate, pattern misalignment, overlay misalignment, and/or voids and other types of discontinuities, among other examples. By inspecting the semiconductor substrate for defects, the inspection tool 114 may provide data and/or feedback to maintain process control for one or more of the semiconductor processing tools 102-112. Examples of the inspection tool include a scanning electron microscope (SEM), a transmissive electronic microscope (TEM), and/or another type of electron beam inspection tool, among other examples.

Wafer/die transport tool 116 includes a mobile robot, a robot arm, a tram or rail car, an overhead hoist transport (OHT) system, an automated material-handling system (AMHS), and/or another type of device that is configured to transport semiconductor substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the environment 100 includes a plurality of wafer/die transport tools 116.

For example, the wafer/die transport tool 116 may be included in a cluster tool or another type of tool that includes a plurality of processing chambers, and may be configured to transport semiconductor substrates and/or semiconductor devices between the plurality of processing chambers, to transport semiconductor substrates and/or semiconductor devices between a processing chamber and a buffer area, to transport semiconductor substrates and/or semiconductor devices between a processing chamber and an interface tool such as an equipment front end module (EFEM), and/or to transport semiconductor substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a semiconductor substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport semiconductor substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-114 include a chucking component that supports (e.g., temporarily fixes, temporarily aligns, or temporarily positions, among other examples) the semiconductor substrate during a respective manufacturing process. As an example, the inspection tool 114 may include an electrostatic chuck (ESC) 118, as shown in FIG. 1A.

FIG. 1B shows an example implementation of the ESC 118. In FIG. 1B, the ESC 118 supports a semiconductor substrate 120 (e.g., a semiconductor wafer) within the inspection tool 114. The ESC 118 is configured to generate an attracting force between the ESC 118 and the semiconductor substrate 120 based on a voltage applied to the ESC 118. The voltage may be provided from a power supply that provides a high bias voltage to the ESC 118. The attractive force (e.g., a Coulomb force) may cause the semiconductor substrate 120 to be retained on and supported by the ESC 118.

The ESC 118 may be sized and shaped depending on a size and a shape of the semiconductor substrate 120. For example, the ESC 118 may be circular shaped and may support all or a portion of the semiconductor substrate 120, which is also circular shaped. The ESC 118 may be constructed of a metal, such as aluminum, stainless steel, or another suitable material.

As shown, the ESC 118 positions the semiconductor substrate 120 relative to a component 122 of the inspection tool 114. In an implementation where the inspection tool 114 includes a scanning electron microscope (SEM), the component 122 may correspond to a lens cap structure (e.g., a structure housing one or more lenses through which one or more electron beams pass). The inspection tool 114 may further include an electrical ground 124.

As shown in FIG. 1B, a topside surface 126 of the semiconductor substrate 120 includes an electrical potential 128 (e.g., an electrical charge). Although shown in FIG. 1B as positive, the polarity of the electrical potential may be negative. In some implementations, the inspection tool 114 generates an electron beam that scans the topside surface 126. During a scanning of the topside surface 126, the electron beam may create a condition relating to a change in the electrical potential 128. For example, the electron beam may result in a build-up of electrons on the topside surface 126 of the semiconductor substrate 120, resulting in formation of a negative charge on the topside surface 126. As another example, the electron beam may impact electrons on the topside surface 126 of the semiconductor substrate 120, which dislodges the electrons and causes the formation of holes. In this example, a build-up of holes is formed, which results in formation of a positive charge on the topside surface 126.

The electrical potential 128 may result in a condition associated with electrical arcing (or an increased likelihood of electrical arcing) between the component 122 and the topside surface 126, the semiconductor substrate 120, and/or the ESC 118. Additionally, or alternatively, the electrical potential 128 may also result in a condition associated with electrical arcing (or an increased likelihood of electrical arcing) between the electrical ground 124 and the topside surface 126, the semiconductor substrate 120, and/or the ESC 118. The electrical arcing may damage a semiconductor device 130 (e.g., a die, an integrated circuit) included on the semiconductor substrate 120. Additionally, or alternatively, the electrical arcing may damage the inspection tool 114.

As used herein, the term "electrical arcing" may refer to any electrical discharge that occurs through a normally non-conductive medium such as an insulating material or air, among other examples. "Electrical arcing," as used herein, may refer to intermittent or discrete electrical discharge (which may also be referred to as an electric spark) and/or to a continuous electrical discharge (which may also be referred to as an electric arc). An electrical discharge may occur, for example, where the electrical potential 128 increases to a magnitude that is sufficient to create an electrically-conductive channel through a non-conductive medium between the semiconductor substrate 120 and the component 122 or between the semiconductor substrate 120 and the electrical ground 124.

One or more conditions associated with the electrical arcing may relate to one or more materials included in the semiconductor substrate 120. For example, if the semiconductor substrate 120 includes a silicon material, an electrical potential 128 that is greater than or equal to a band gap of the silicon material may increase a likelihood of electrical arcing. For the silicon material, and as example, the band gap may be included in a range from approximately 1.0 electron volt (eV) to approximately 1.5 eV.

To reduce the likelihood of the electrical arcing, a tip of an electrically-conductive pin 132 (or tips of a set including one or more electrically-conductive pins 132) may be positioned near a backside surface 134 of the semiconductor substrate 120 and near or within a region including the electrical potential 128. In this way, a charge may be transferred from the electrically-conductive pin 132 to the semiconductor substrate 120 to reduce the magnitude of the electrical potential 128 and/or to neutralize the electrical potential 128. Reducing the magnitude of and/or neutralizing the electrical potential 128 reduces the likelihood of and/or prevents formation of an electrically-conductive channel between the semiconductor substrate 120 and the component 122 and/or between the semiconductor substrate 120 and the electrical ground 124, which reduces the likelihood of electrical arcing.

In some implementations, the tip of the electrically-conductive pin 132 is positioned at a distance 136 that is in a range of greater than 0 microns (μm) to less than or equal to approximately 1 μm from the backside surface 134 of the semiconductor substrate 120. Positioning the tip within this range may allow for a power supply to provide, through the electrically-conductive pin 132, a charge that neutralizes (or reduces the magnitude of) the electrical potential 128 without damaging the semiconductor substrate 120. However, other values and/or ranges (including ranges that result in the electrically-conductive pin 132 contacting the backside surface 134 or other surfaces of the semiconductor substrate 120) for the distance 136 are within the scope of the present disclosure.

Other semiconductor processing tools (e.g., the semiconductor processing tools 102-112, among other examples) may include a chucking component (e.g., a vacuum-chucking component or a variation of the ESC 118, among other examples) and variations of the electrically-conductive pin 132. Additionally, or alternatively, the tip of the electrically-conductive pin 132 may be positioned near the topside surface 126 of the semiconductor substrate 120 or near the chucking component of the other semiconductor processing tools to neutralize the electrical potential 128.

FIG. 1C shows an example implementation of the ESC 118. In the example implementation, the ESC 118 includes an electrode 138 and a substrate 140. A voltage may be applied to the electrode 138 to generate a Coulomb force which attracts the semiconductor substrate 120 to the electrode 138 for the ESC 118 to support (e.g., temporarily fix, temporarily align, or temporarily position, among other examples) the semiconductor substrate 120.

The electrode 138 includes a pin-guide 142 through which the electrically-conductive pin 132 may be positioned. The pin-guide 142 may include a cylindrical hole or include a bushing, among other examples. In some implementations, the electrically-conductive pin 132 is positioned so that a tip of the electrically-conductive pin 132 protrudes from an exit of the pin-guide 142. In some implementations, the electrically-conductive pin 132 is positioned so that a tip of the electrically-conductive pin 132 remains within the pin-guide 142. As shown in FIG. 1C, the tip of the electrically-conductive pin 132 is within a region 144 including the electrical potential 128.

As shown in FIG. 1C, the electrically-conductive pin 132 may be included as part of a voltage-regulation system 146 that may change the electrical potential 128 of the region 144. In addition to the electrically-conductive pin 132, the voltage-regulation system 146 includes a sensor 148 (e.g., a voltage-level sensor, among other examples). The voltage-regulation system 146 further includes a power supply 150 (e.g., a power supply that can generate a positive electrical potential or a negative electrical potential, among other examples) that is electrically coupled to the electrically-conductive pin 132.

The voltage-regulation system 146 further includes a pin-positioning subsystem 152 that is mechanically coupled to the electrically-conductive pin 132. The pin-positioning subsystem 152 may include one or more components such as a linear induction motor component, a servo motor component, a stepper motor component, a pneumatic cylinder component, or a ball screw component, among other examples. The pin-positioning subsystem 152 may cause a combination of one or more of a vertical motion 154 and/or a lateral motion 156 to position the tip of the electrically-conductive pin 132 within the region 144 including the electrical potential 128. In an implementation where there is a set including a plurality of the electrically-conductive pins 132, the one or more components of the pin-positioning subsystem 152 may provide independent positioning control to each electrically-conductive pin 132 of the set.

The voltage-regulation system 146 further includes a controller 158. The controller 158 may include a processor, a combination of a processor and memory, and/or a transceiver that transmits and receives signals, among other examples. As shown in FIG. 1C, the controller 158 is communicatively connected to the sensor 148, the power supply 150, and the pin-positioning subsystem 152 using one or more communication links 160 (e.g., one or more wireless-communication links, one or more wired-communication links, or a combination of one or more wireless-communication links and one or more wired-communication links, among other examples).

The controller 158 may perform one or more processes. As an example, the controller 158 may receive voltage measurement data from the sensor 148 and, based on the voltage measurement data, determine that the electrical potential 128 of the region 144 does not satisfy a threshold. The controller 158 may be further configured to transmit a signal to the pin-positioning subsystem 152 to cause the pin-positioning subsystem 152 to position a tip of the electrically-conductive pin 132 within the region 144. The controller 158 may transmit another signal to the power-supply 150 so that the electrically-conductive pin 132 transfers an electrical charge to the region 144 so that the electrical potential 128 of the region 144 satisfies the threshold.

The controller 158 may use a machine learning model to determine one or more conditions that may be associated with electrical arcing. The machine learning model may include and/or may be associated with one or more of a neural network model, a random forest model, a clustering model, or a regression model, among other examples. In some implementations, the controller 158 uses the machine learning model to determine the one or more conditions by providing candidate voltage measurements of the region 144, positioning measurements of the semiconductor substrate 120 above the ESC 118, warpage measurements of the semiconductor substrate 120, and/or operating parameters of the inspection tool 114 as input to the machine learning model. Using the machine learning model, the controller 158 may determine a likelihood, probability, or confidence that a particular outcome (e.g., electrical arcing) for a subsequent inspection operation will be achieved using the candidate measurements and/or parameters. In some implementations, the controller 158 provides a condition in which electrical arcing does not occur as input to the machine learning model, and the controller 158 uses the machine learning model to determine or identify a particular combination of operating and/or positioning parameters that are likely to achieve the condition in which electrical arcing is prevented.

The controller 158 (or another system) may train, update, and/or refine the machine learning model to increase the accuracy of the outcomes and/or parameters determined using the machine learning model. The controller 158 may train, update, and/or refine the machine learning model based on feedback and/or results from the subsequent inspection operation, as well as from historical or related inspection operations (e.g., from hundreds, thousands, or more historical or related inspection operations) performed by the inspection tool 114.

The controller 158 may perform one or more processes to change the electrical potential 128 of the region 144. As an example, and for a positive charge causing the electrical potential 128 as shown in FIG. 1C, the one or more processes may include receiving, by the controller 158 from the sensor 148, a first signal including voltage measurement data, and identifying, by the controller 158 based on the voltage measurement data, a region (e.g., the region 144) of positive charge of the semiconductor substrate 120 supported by the ESC 118. Continuing, the one or more processes may include transmitting, by the controller 158 based on identifying the region 144 of positive charge, a second signal including positioning data to the pin-positioning subsystem 152 to cause the pin-positioning subsystem 152 to position the tip of an electrically-conductive pin 132 within the region 144 of the positive charge. The one or more processes may also include transmitting a third signal to adjust a setting of the power supply 150 so that the electrically-conductive pin 132 transfers a negative charge to the region 144 to neutralize the positive charge.

In some implementations of FIG. 1C, and elsewhere herein, positioning and/or supporting the semiconductor substrate 120 above the ESC 118 while the voltage-regulation system 146 changes the electrical potential 128 includes separating the semiconductor substrate 120 from a surface of the electrode 138 using lift pins and/or a vacuum wand (not illustrated). In some implementations of FIG. 1C, and elsewhere herein, positioning and/or supporting the semiconductor substrate 120 above the ESC 118 while the voltage-regulation system 146 changes the electrical potential 128 includes the semiconductor substrate 120 contacting the surface of the electrode 138.

The number and arrangement of devices shown in FIGS. 1A-1C are provided as one or more examples. In practice, there may be additional devices, fewer devices, different devices, or differently arranged devices than those shown in FIGS. 1A-1C. Furthermore, two or more devices shown in FIGS. 1A-1C may be implemented within a single device, or a single device shown in FIGS. 1A-1C may be implemented as multiple, distributed devices. For example, and described in connection with FIG. 2 and elsewhere herein, an array including one or more of the pin-guides 142 may be included in the electrode 138 and a set including one or more of the electrically-conductive pins 132 may be included as part of the voltage-regulation system 146. Additionally, or alternatively, a set of devices (e.g., one or more devices) of environment 100 may perform one or more functions described as being performed by another set of devices of environment 100.

Figure 2:
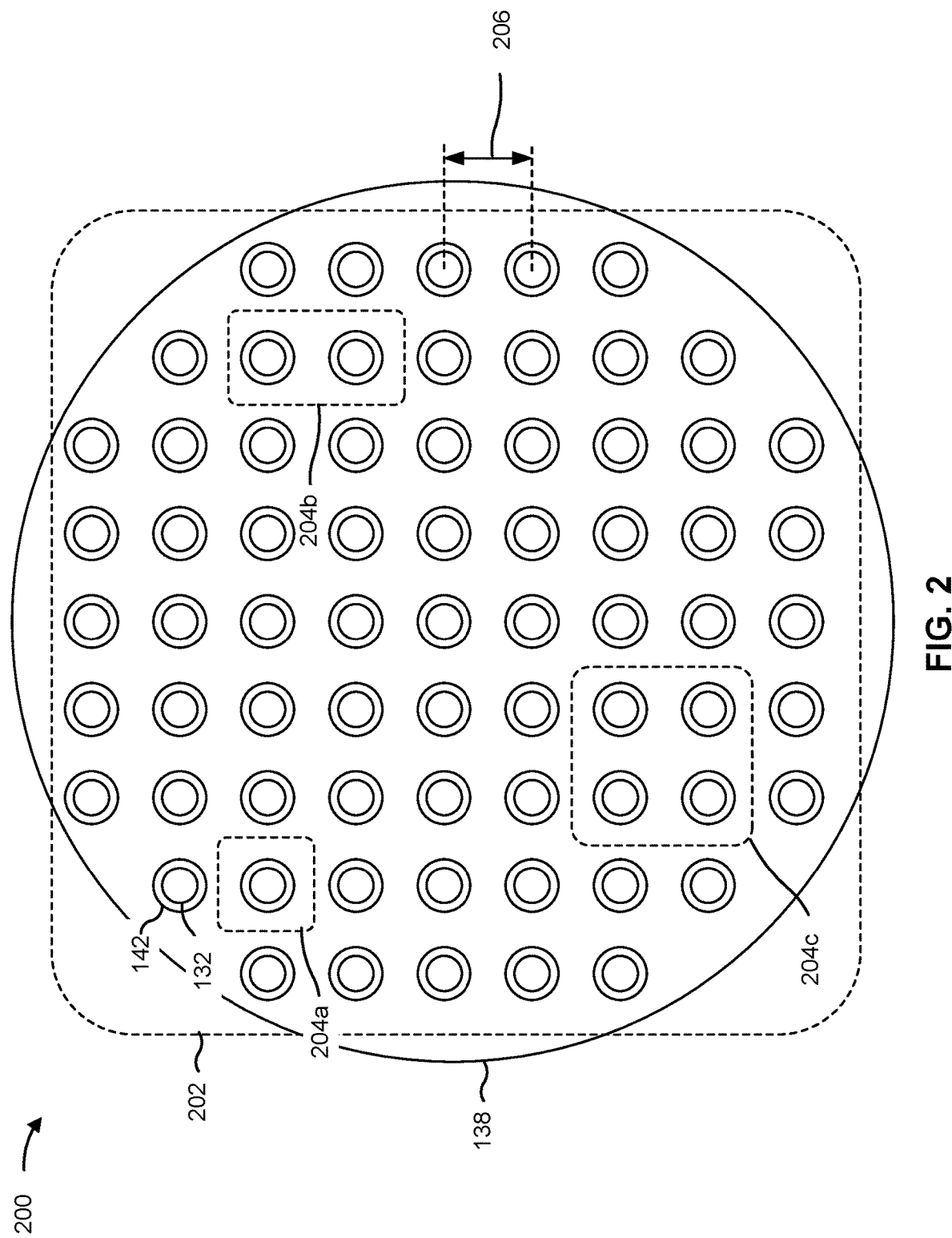
FIG. 2 is a diagram of an example implementation of an array of electrically-conductive pins and pin-guides described herein.

FIG. 2 is a diagram of an example implementation 200 of an array 202 of electrically-conductive pins 132 and pin-guides 142 described herein. The array 202 may be formed such that the electrically-conductive pins 132 and the pin-guides 142 pass through the electrode 138.

The array 202 includes one or more of the electrically-conductive pins 132 and one or more of the pin-guides 142. In some implementations, the voltage-regulation system 146 (e.g., the controller 158 in combination with the pin-positioning subsystem 152) may select a set 204 from the array 202. For example, the voltage-regulation system 146 may select a set 204a that includes one of the electrically-conductive pins 132 and one of the pin-guides 142 to change the electrical potential 128 in a region of the semiconductor substrate 120. Additionally, or alternatively, the voltage-regulation system 146 may select a set 204b that includes two of the electrically-conductive pins 132 and two of the pin-guides 142 to change the electrical potential 128 in another region of the semiconductor substrate 120. Additionally, or alternatively, the voltage-regulation system 146 may select a set 204c that includes four of the electrically-conductive pins 132 and four of the pin-guides 142 to change the electrical potential 128 in another region of the semiconductor substrate 120. The sets 204a, 204b, and 204c are provided as examples. In other examples, sets of additional or different numbers of the electrically-conductive pins 132 and the pin-guides 142 may be selected.

As shown in FIG. 2, and as an example, the array 202 includes an "X by X" pattern having a linear spacing 206 of approximately 5.0 centimeters (cm). However, other patterns (e.g., a linear pattern, a radial pattern, among other examples) and spacings (including variable spacings) are within the scope of the present disclosure.

In accordance with FIG. 2, the array 202 of electrically-conductive pins 132 and pin-guides 142 may be included in a semiconductor processing tool (e.g., the semiconductor processing tool 114) including the controller 158. Furthermore, the array 202 of electrically-conductive pins 132 and pin-guides 142 may be used in one or more processes performed by the semiconductor processing tool.

For example, and in accordance with the array 202 of FIG. 2, the controller 158 may perform one or more processes so that the electrical potential 128 of the region 144 satisfies a threshold. The one or more processes may include receiving, by the controller 158 from the sensor 148 associated with the region 144 of the semiconductor substrate 120 supported by the ESC 118, a first signal including voltage measurement data and determining, by the controller 158 based on the voltage measurement data, that the electrical potential 128 of the region 144 does not satisfy a threshold. The one or more processes may further include transmitting, by the controller 158 based on determining that the electrical potential 128 does not satisfy the threshold, a second signal to cause the pin-positioning subsystem 152 to position tips of a set 204c of electrically-conductive pins 132 within the region 144 and transmitting a third signal to activate the power supply 150 so that the set 204c of electrically-conductive pins 132 transfer an electrical charge to the region 144 so that the electrical potential 128 of the region 144 satisfies the threshold.

Additionally, or alternatively, the semiconductor processing tool may include the ESC 118 having the electrode 138, the array 202 of pin-guides 142 through the electrode 138, and the voltage-regulation system 146. The voltage-regulation system 146 may include the pin-positioning subsystem 152, the set 204 of electrically-conductive pins 132, and the power supply 150 electrically coupled with the set 204 of electrically-conductive pins 132. The voltage-regulation system 146 may further include the controller 158 that is configured to determine that a condition associated with electrical arcing, between the topside surface 126 of the semiconductor substrate 120 positioned above the electrode 138 and the component 122 of the semiconductor processing tool, has occurred. Continuing, the controller 158 may be configured to transmit, based on determining that the condition has occurred, a first signal to cause the pin-positioning subsystem 152 to position one or more tips of a corresponding one or more electrically-conductive pins 132, of the set 204 of electrically-conductive pins 132, near or through exits of one or more pin-guides 142 of the array 202 of pin-guides 142. The controller 158 may be further configured to transmit a second signal to cause the power supply 150 to adjust a setting so that the one or more electrically-conductive pins 132 transfer an electrical charge to or from the semiconductor substrate 120 to change the electrical potential 128 of the region 144 of the semiconductor substrate 120 including the topside surface 126.

As indicated above, FIG. 2 is provided as an example. Other examples may differ from what is described with regard to FIG. 2.

Figure 3B:
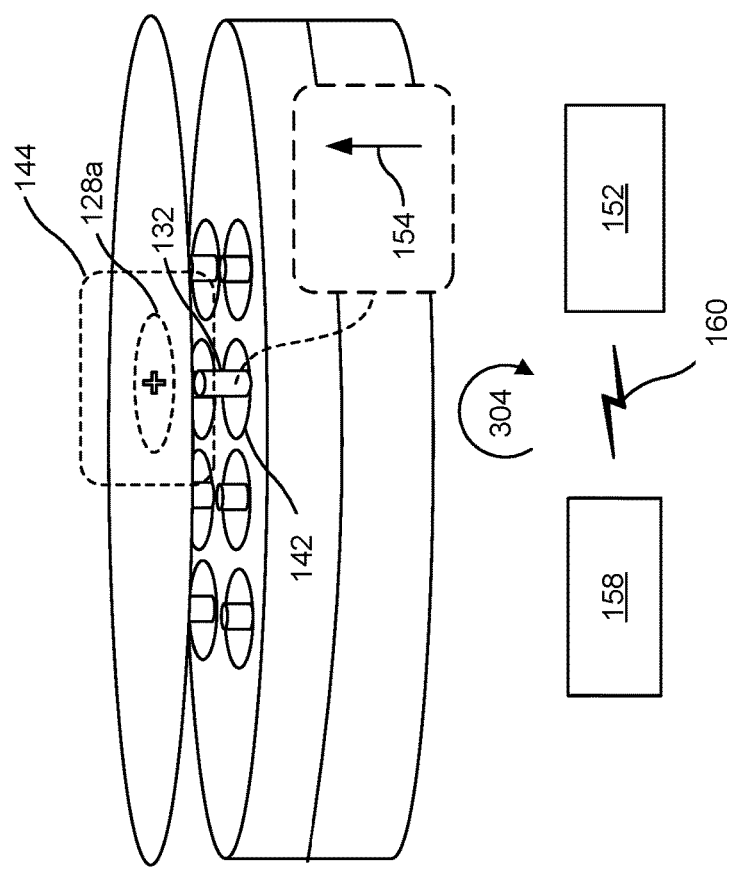

FIGS. 3A-3C are diagrams of an example implementation 300 of the voltage-regulation system 146 described herein.

For simplicity, the implementation describes processes performed by the voltage-regulation system 146 including a single electrically-conductive pin 132. However, different permutations, combinations, and/or variations of the implementation may use a set of one or more electrically conductive pins 132 as set forth in the array 202 of FIG. 2 and elsewhere herein.

Beginning with FIG. 3A, process 302 includes the controller 158 receiving a first signal from the sensor 148 using the one or more communication links 160. The controller 158 may, based on voltage measurement data included in the first signal, determine an electrical potential 128a (e.g., a positive bias or charge) of the region 144 does not satisfy a threshold.

As an example, the threshold may correspond to an upper threshold that is in a range from approximately 1.0 eV to approximately 1.5 eV, in which case satisfying the threshold corresponds to the electrical potential 128a being less than approximately 1.0 eV to approximately 1.5 eV. By selecting the threshold in this range, a likelihood of electrical arcing between the region 144 and the component 122 of the inspection tool 114, due to a band gap of silicon being exceeded, is reduced. However, other values and/or ranges for the threshold are within the scope of the present disclosure.

Additionally, or alternatively, the threshold may correspond to a uniformity threshold across multiple regions of the semiconductor substrate 120. The controller 158 may, based on the voltage measurement data associated with the region 144 and other voltage measurement data associated with other regions of the semiconductor substrate 120, determine that a uniformity metric (e.g., a distribution, a standard deviation, or a range, among other examples) across the semiconductor substrate 120 does not satisfy the threshold.

Furthermore, the controller 158 may determine that the electrically-conductive pin 132 is in a retracted state and that a tip of the electrically-conductive pin 132 is below the region 144.

In FIG. 3B as part of process 304, and based on determining that the electrical potential 128a of the region 144 does not satisfy the threshold, the controller 158 transmits a second signal using the one or more communication links 160 to the pin-positioning subsystem 152. The second signal may cause the pin-positioning subsystem 152 to position, using the vertical motion 154, the electrically-conductive pin 132 such that the tip of the electrically-conductive pin 132 is within a particular distance of a backside surface 134 of the semiconductor substrate 120.

As part of process 306 in FIG. 3C, the controller 158 transmits a third signal using the one or more communication links 160 to the power supply 150. In some implementations, the third signal causes the power supply 150 to neutralize the electrical potential 128a. As shown in FIG. 3C, the power supply 150 may neutralize the electrical potential 128a by providing another electrical potential 128b (e.g., a negative bias or charge).

In some implementations, the electrically-conductive pin 132 may discharge the electrical potential 128a (e.g., the power supply 150 is in a neutral state and does not bias the electrically-conductive pin 132 using the other electrical potential 128b).

As indicated above, FIGS. 3A-3C are provided as examples. Other examples may differ from what is described with regard to FIGS. 3A-3C. The implementation of FIGS. 3A-3C may additionally, or alternatively, use a plurality of the electrically-conductive pins 132, including one or more of the sets 204 as described in connection with FIG. 2. As an example, the implementation of FIGS. 3A-3C may use a first set including a first quantity of electrically-conductive pins 132 and, concurrently or successively, a second set including a second quantity of electrically-conductive pins 132.

Figure 4A:
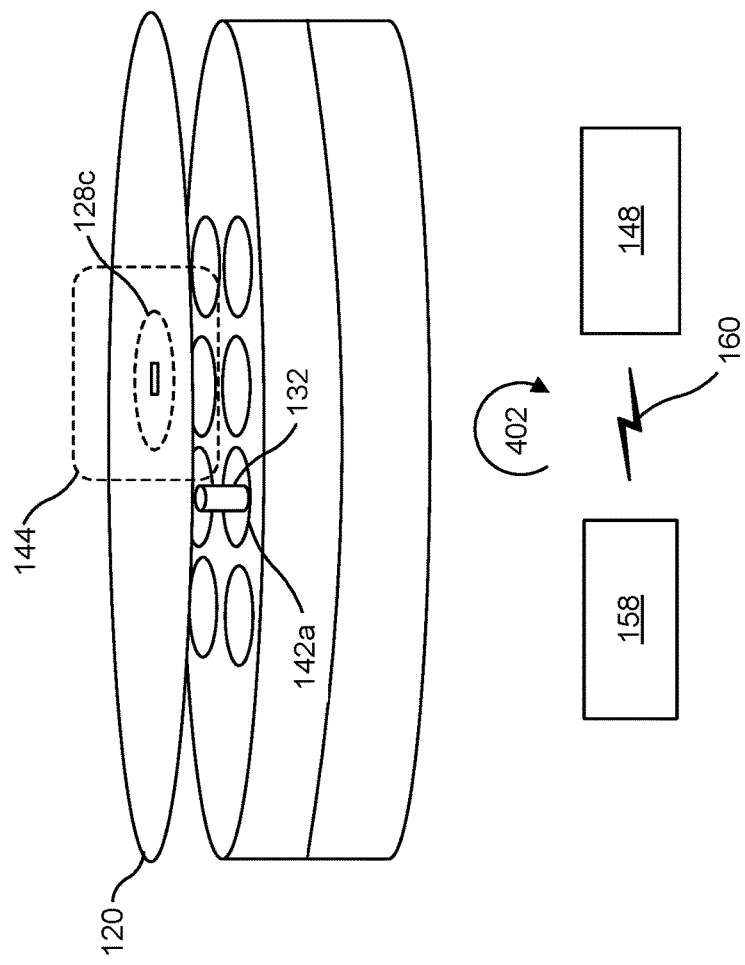
Figure 4B:
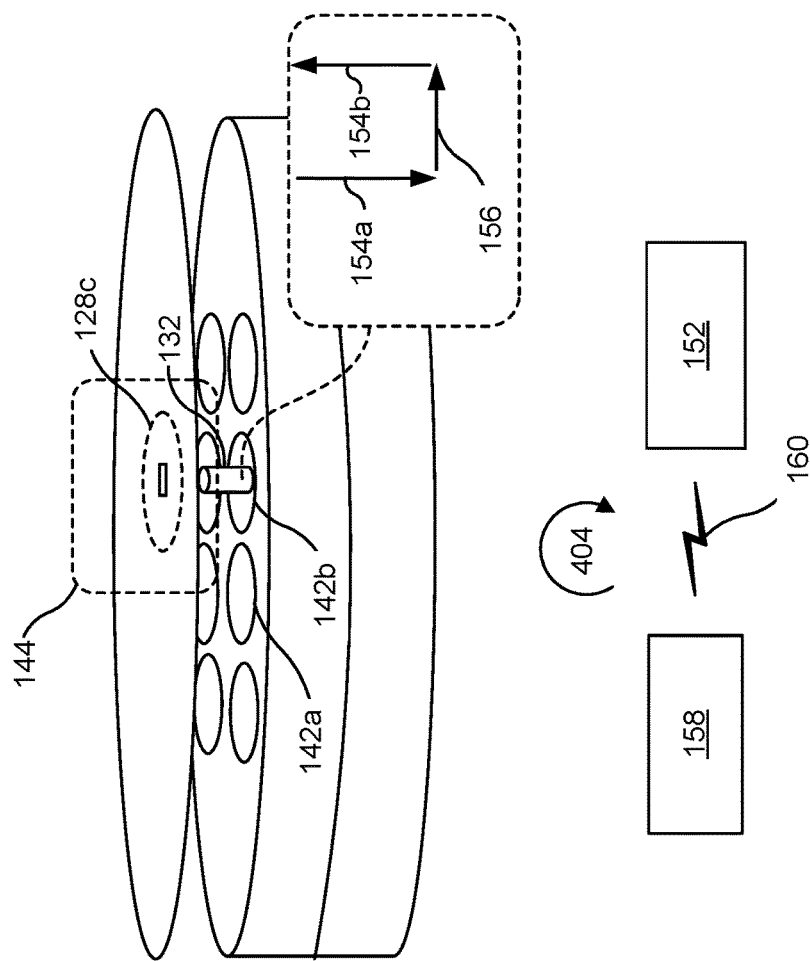
Figure 4C:
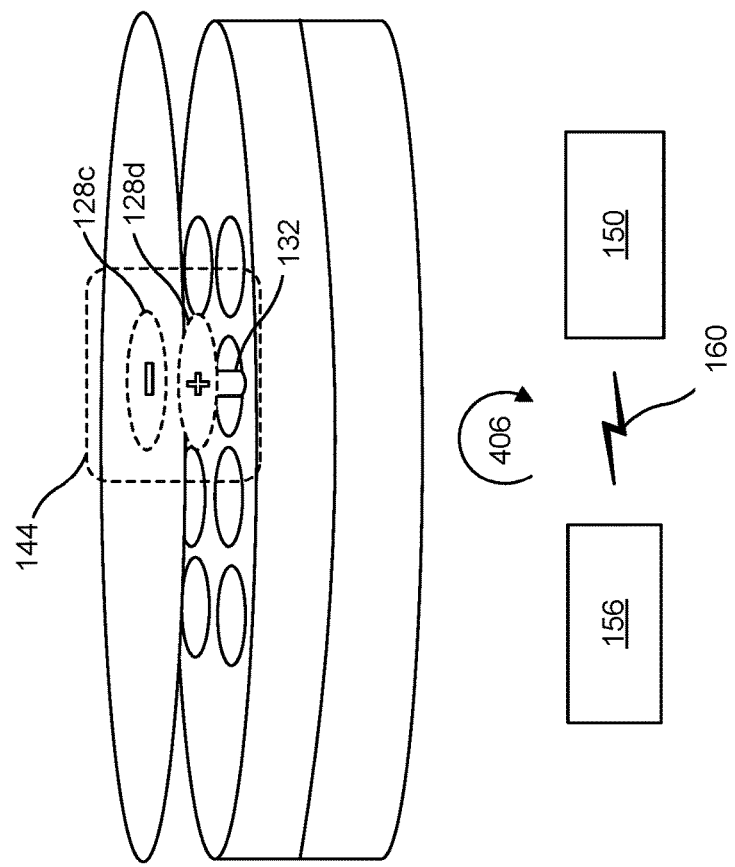

FIGS. 4A-4C are diagrams of an example implementation 400 of the voltage-regulation system 146 described herein. For simplicity, the implementation describes processes performed by the voltage-regulation system 146 including a single electrically-conductive pin 132. However, different permutations, combinations, and/or variations of the implementation may use a set of one or more electrically conductive pins 132 as set forth in the array 202 of FIG. 2 and elsewhere herein.

Beginning with FIG. 4A, process 402 includes the controller 158 receiving a first signal from the sensor 148 using the one or more communication links 160. The controller 158 may determine an electrical potential 128c (e.g., a negative bias or charge) of the region 144 does not satisfy a threshold (e.g., the electrical potential 128c is greater than a band gap of silicon, among other examples). Furthermore, the controller 158 may determine that the electrically-conductive pin 132 is within the pin-guide 142a and that a tip of the electrically-conductive pin 132 is not within the region 144.

In FIG. 4B as part of process 404, and based on determining that the electrical potential 128c of the region 144 does not satisfy the threshold, the controller 158 transmits a second signal using the one or more communication links 160 to the pin-positioning subsystem 152. The second signal may cause the pin-positioning subsystem 152 to reposition the electrically-conductive pin 132 from the pin-guide 142a to another pin-guide 142b.

For example, the pin-positioning subsystem 152 may use a pneumatic cylinder component to retract the pin from the pin-guide 142a using vertical motion 154a. Continuing with the example, the pin-positioning subsystem 152 may use a linear induction motor component to laterally reposition the electrically-conductive pin 132 from pin-guide 142a to pin guide 142b (e.g., amongst two or more pin-guides) and to within the region 144 using lateral motion 156. Continuing with the example, the pin-positioning subsystem 152 may use the pneumatic cylinder component to extend the electrically-conductive pin 132 such that a tip of the electrically-conductive pin 132 is within a particular distance of a backside surface 134 of the semiconductor substrate 120.

As part of process 406 in FIG. 4C, the controller 158 transmits a third signal using the one or more communication links 160 to the power supply 150. In some implementations, the third signal causes the power supply 150 to neutralize the electrical potential 128c. As shown in FIG. 4C, the power supply 150 may neutralize the electrical potential 128c by providing another electrical potential 128d (e.g., a positive bias or charge).

As indicated above, FIGS. 4A-4C are provided as examples. Other examples may differ from what is described with regard to FIGS. 4A-4C. For example, the implementation of FIGS. 4A-4C may additionally, or alternatively, use a plurality of the electrically-conductive pins 132, including one or more sets 204 as described in connection with FIG. 2 and elsewhere herein.

Figure 5B:
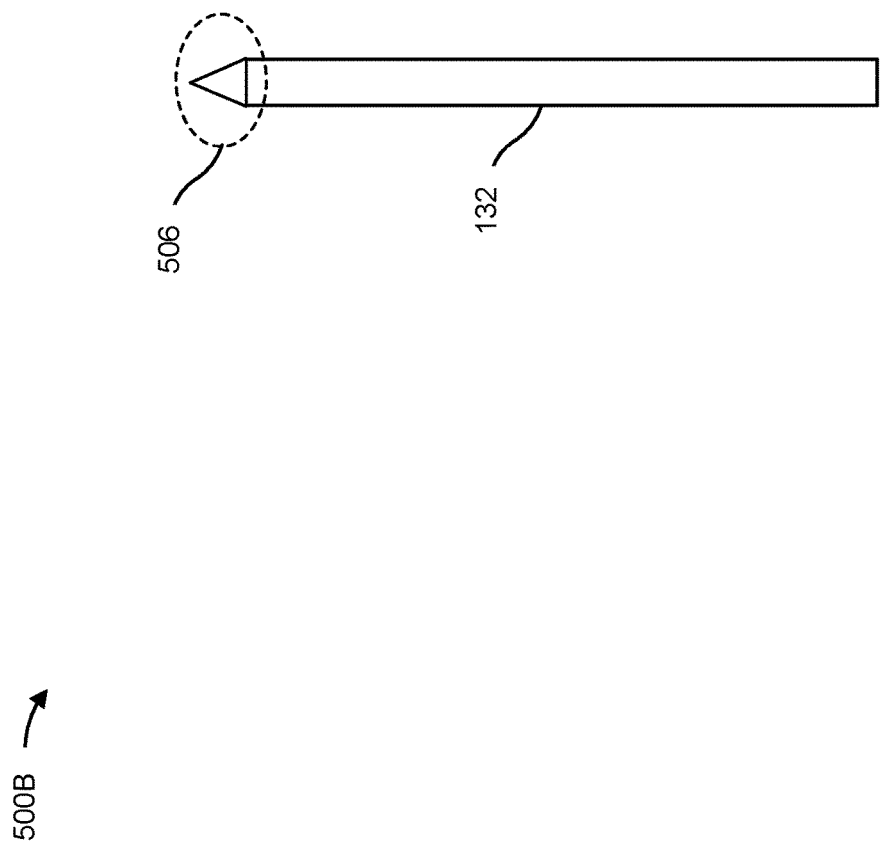

FIGS. 5A and 5B are diagrams of an example implementations 500A and 500B of electrically-conductive pins 132 described herein. The electrically-conductive pins 132 of FIGS. 5A and 5B may include one or more materials. In some implementations, the electrically-conductive pins 132 include a carbon nanotube material. In some implementations, the electrically-conductive pins 132 include another material, such as aluminum, copper, gold, or tungsten, among other examples.

As shown in FIG. 5A, the electrically-conductive pin 132 may have a length 502 in a range from approximately 20.0 centimeters (cm) to approximately 30.0 cm. By having the length 502 in this range, the electrically-conductive pin 132 may pass through the ESC 118 and mechanically connect to the pin-positioning subsystem 152. However, other values and/or ranges of the length 502 are within the scope of the present disclosure.

Also as shown in FIG. 5A, the electrically-conductive pin 132 may have a diameter 504 in a range from approximately 1.0 nanometer (nm) to approximately 2.0 nm. By having the diameter 504 in this range, the electrically-conductive pin 132 may be compatible with an inclusion of a carbon nanotube material in the electrically-conductive pin 132. However, other values and/or ranges of the diameter 504 are within the scope of the present disclosure.

In some implementations, and as shown in FIG. 5B, the electrically-conductive pin 132 includes a pointed tip 506. The pointed tip 506 may increase a positioning accuracy of the electrically-conductive pin 132 by the pin-positioning subsystem 152. In an implementation where the electrically-conductive pin 132 makes physical contact with the backside surface 134 of the semiconductor substrate 120, the pointed tip 506 may penetrate an oxide growth to improve a quality of electrical contact with the backside surface 134. In some implementations, the voltage-regulation system 146 includes electrically-conducive pins 132 that include a combination of non-pointed tips and pointed tips.

As indicated above, FIGS. 5A and 5B are provided as examples. Other examples may differ from what is described with regard to FIGS. 5A and 5B.

Figure 6:
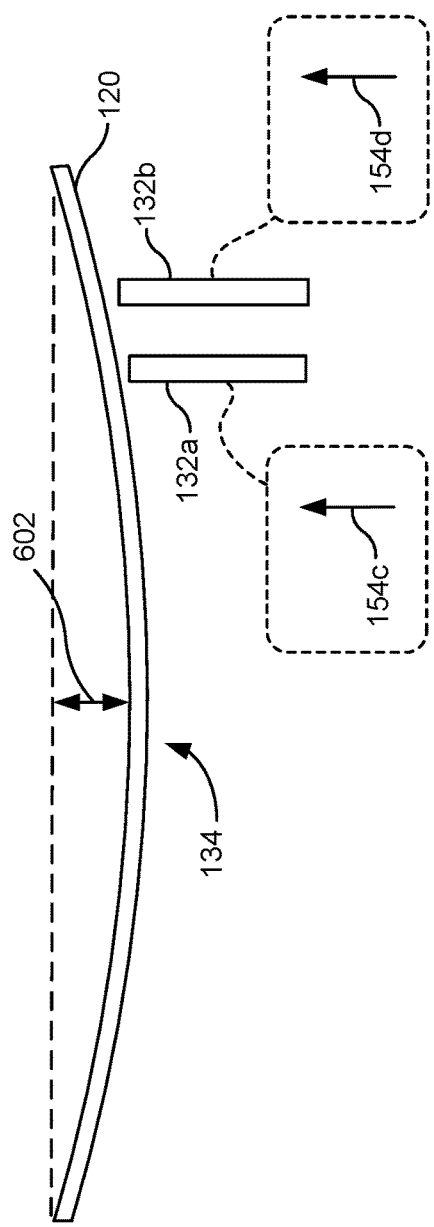

FIG. 6 is an example implementation 600 of the electrically-conductive pin 132 described herein. As shown in FIG. 6, the semiconductor substrate 120 has a degree of warpage 602. In some implementations, the controller 158 identifies the degree of warpage 602 based on information received with a batch (e.g., a group or a lot) of semiconductor substrates 120 provided to the inspection tool 114. In some implementations, the controller 158 identifies the degree of warpage 602 based on a measurement performed by the inspection tool 114.

The controller 158 may, based on the degree of warpage 602, transmit a signal to cause the pin-positioning subsystem 152 to individually adjust a "throw" of one or more electrically-conductive pins 132 to compensate for the degree of warpage 602. As an example, and as shown in FIG. 6, a throw (e.g., a vertical motion 154c) of an electrically-conductive pin 132a is different than another throw (e.g., a vertical motion 154d) of an electrically-conductive pin 132b. The difference in throws may compensate for the degree of warpage 602 and position the tips of the electrically-conductive pins 132a and 132b within a same range (e.g. distance) from the backside surface 134 of the semiconductor substrate.

As indicated above, FIG. 6 is provided as an example. Other examples may differ from what is described with regards to FIG. 6.

Figure 7:
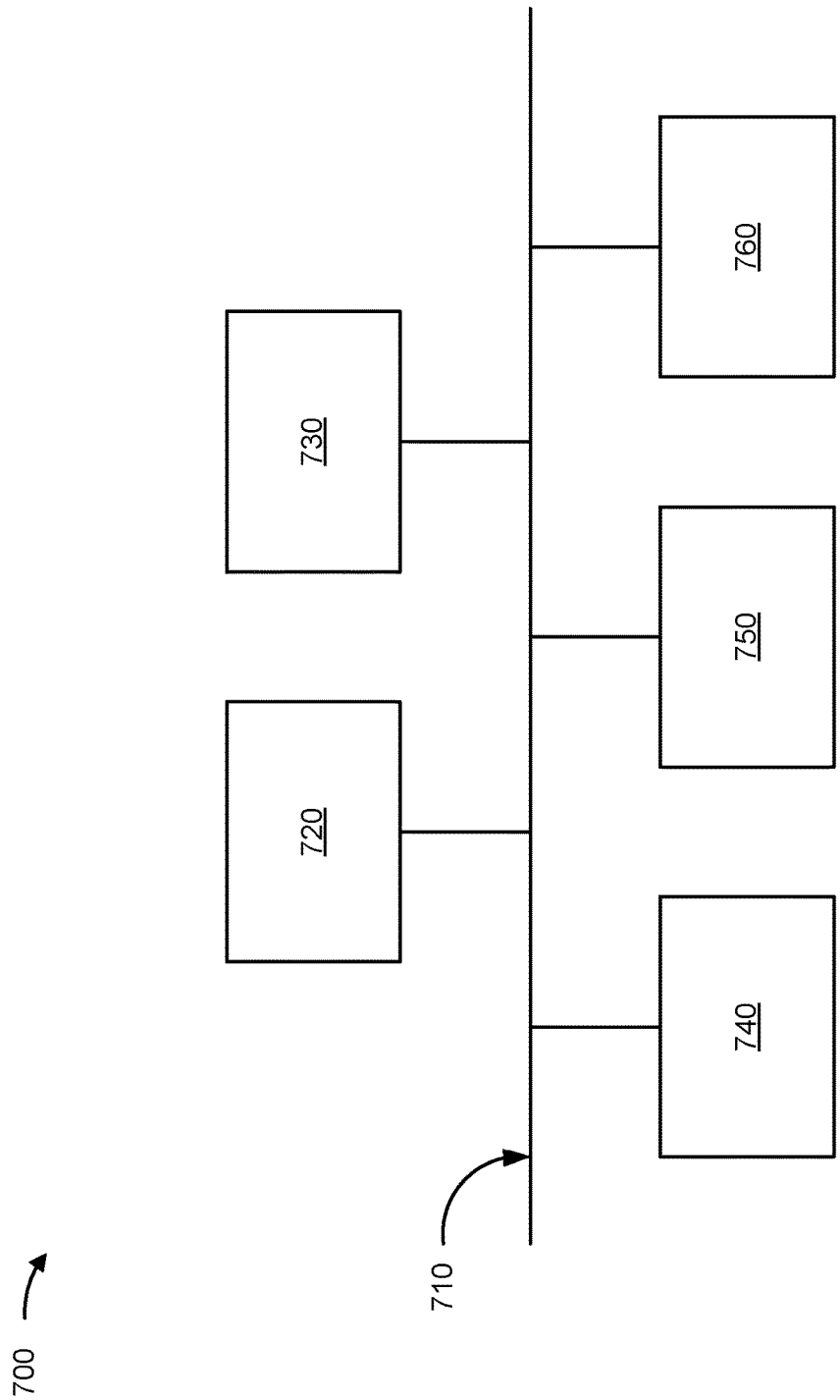
FIG. 7 is a diagram of example components of one or more devices described herein.

FIG. 7 is a diagram of example components of a device 700, which may correspond to one or more of the semiconductor processing tools 102-112, the inspection tool 114, the sensor 148, the power supply 150, the pin-positioning subsystem 152, and/or the controller 158. In some implementations, one or more of the semiconductor processing tools 102-112, the inspection tool 114, the sensor 148, the power supply 150, the pin-positioning subsystem 152, and/or the controller 158 include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
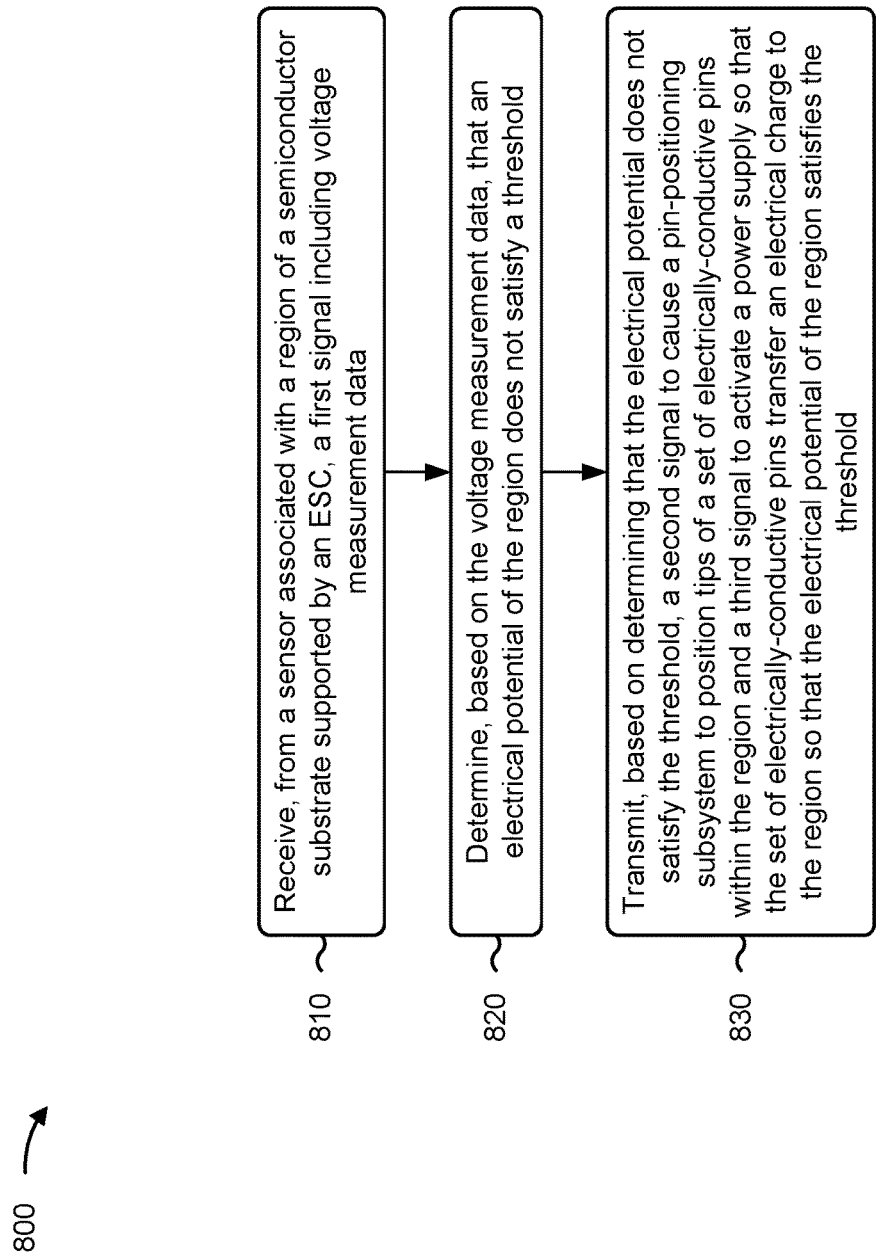
FIGS. 8 and 9 are flowcharts of example processes related to a semiconductor processing tool including the voltage-regulation system described herein.

FIG. 8 is a flowchart of example processes related to a semiconductor processing tool including the voltage-regulation system described herein. In some implementations, one or more process blocks of FIG. 8 are performed by a controller (e.g., controller 158). In some implementations, one or more process blocks of FIG. 8 are performed by another device or a group of devices separate from or including the controller 158, such as the inspection tool 114, the sensor 148, the power supply 150, and/or the pin-positioning subsystem 152. Additionally, or alternatively, one or more process blocks of FIG. 8 may be performed by one or more components of device 700, such as processor 720, memory 730, input component 740, output component 750, and/or communication component 760.

As shown in FIG. 8, process 800 may include receiving, from a sensor associated with a region of a semiconductor substrate supported by an ESC, a first signal including voltage measurement data (block 810). For example, the controller 158 may receive, from a sensor 148 associated with a region 144 of a semiconductor substrate 120 supported by an ESC 118, a first signal including voltage measurement data, as described above.

As further shown in FIG. 8, process 800 may include determining, based on the voltage measurement data, that an electrical potential of the region does not satisfy a threshold (block 820). For example, the controller 158 may determine, based on the voltage measurement data, that an electrical potential 128 of the region 144 does not satisfy a threshold, as described above.

As further shown in FIG. 8, process 800 may include transmitting, based on determining that the electrical potential does not satisfy the threshold, a second signal to cause a pin-positioning subsystem to position tips of a set of electrically-conductive pins within the region and a third signal to activate a power supply so that the set of electrically-conductive pins transfer an electrical charge to the region so that the electrical potential of the region satisfies the threshold (block 830). For example, the controller 158 may transmit, based on determining that the electrical potential 128 does not satisfy the threshold, a second signal to cause a pin-positioning subsystem 152 to position tips of a set of electrically-conductive pins 132 within the region 144 and a third signal to activate a power supply 150 so that the set of electrically-conductive pins 132 transfer an electrical charge to the region 144 so that the electrical potential 128 of the region satisfies the threshold, as described above.

Process 800 may include additional implementations, such as any single implementation or any combination of implementations described below and/or in connection with one or more other processes described elsewhere herein.

In a first implementation, determining that the electrical potential 128 does not satisfy the threshold includes determining that the electrical potential 128 is greater than or equal to a band gap of a material of the semiconductor substrate 120.

In a second implementation, alone or in combination with the first implementation, process 800 includes the material of the semiconductor substrate 120 includes silicon, and the band gap is included in a range from approximately 1.0 electron volt (eV) to approximately 1.5 eV.

In a third implementation, alone or in combination with one or more of the first and second implementations, determining that the electrical potential 128 does not satisfy the threshold includes determining that the electrical potential 128 does not satisfy a uniformity threshold based on one or more other electrical potentials of one or more other regions of the semiconductor substrate 120.

In a fourth implementation, alone or in combination with one or more of the first through third implementations, transmitting the second signal includes transmitting the second signal to cause the pin-positioning subsystem 152 to position the tips of the set 204 of electrically-conductive pins 132 within the region 144 at a distance 136 that is in a range of greater than 0 microns (μm) to less than or equal to approximately 1 μm from a backside surface 134 of the semiconductor substrate 120.

In a fifth implementation, alone or in combination with one or more of the first through fourth implementations, transmitting the second signal includes transmitting data that identifies the set 204 of electrically-conductive pins 132 from an array 202 of electrically-conductive pins 132 in which the set 204 of electrically-conductive pins 132 is included.

In a sixth implementation, alone or in combination with one or more of the first through fifth implementations, transmitting the third signal includes transmitting the third signal to activate the power supply 150 so that the power supply 150 provides continual power to the set 204 of electrically-conductive pins 132 while the semiconductor substrate 120 is supported by the ESC 118.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Figure 9:
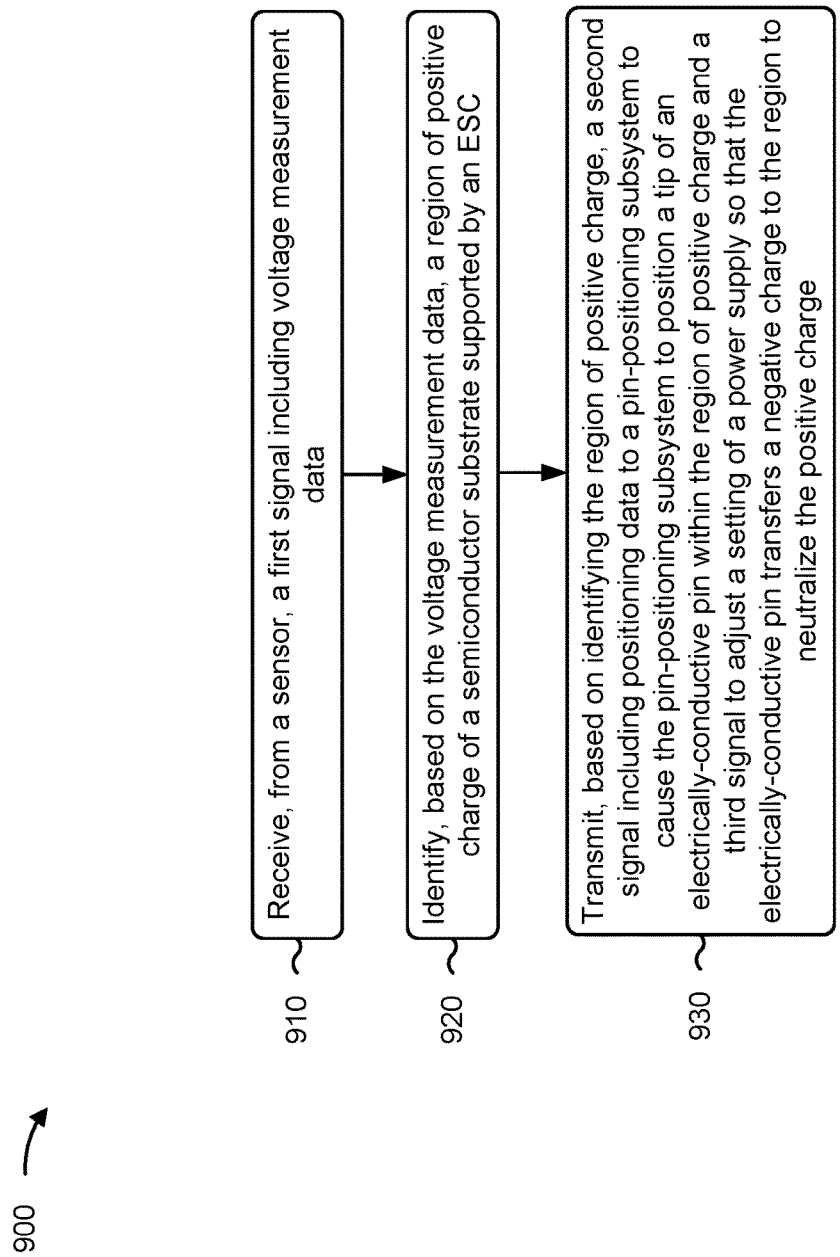

FIG. 9 is a flowchart of example processes related to a semiconductor processing tool including the voltage-regulation system described herein. In some implementations, one or more process blocks of FIG. 9 are performed by a controller (e.g., controller 158). In some implementations, one or more process blocks of FIG. 9 are performed by another device or a group of devices separate from or including the controller 158, such as the inspection tool 114, the sensor 148, the power supply 150, and/or the pin-positioning subsystem 152. Additionally, or alternatively, one or more process blocks of FIG. 8 may be performed by one or more components of device 700, such as processor 720, memory 730, input component 740, output component 750, and/or communication component 760.

As shown in FIG. 9, process 900 may include receiving, from a sensor, a first signal including voltage measurement data (block 910). For example, the controller 158 may receive, from a sensor 148, a first signal including voltage measurement data, as described above.

As further shown in FIG. 9, process 900 may include identifying, based on the voltage measurement data, a region of positive charge of a semiconductor substrate supported by an ESC (block 920). For example, the controller 158 may identify, based on the voltage measurement data, a region 144 of positive charge of a semiconductor substrate 120 supported by an ESC 118, as described above.

As further shown in FIG. 9, process 900 may include transmitting, based on identifying the region of positive charge a second signal including positioning data to a pin-positioning subsystem to cause the pin-positioning subsystem to position a tip of an electrically-conductive pin within the region of positive charge, and a third signal to adjust a setting of a power supply so that the electrically-conductive pin transfers a negative charge to the region to neutralize the positive charge (block 930). For example, the controller 158 may transmit, based on identifying the region 144 of positive charge, a second signal including positioning data to a pin-positioning subsystem 152 to cause the pin-positioning subsystem 152 to position a tip of an electrically-conductive pin 132 within the region 144 of the positive charge, and a third signal to adjust a setting of a power supply 150 so that the electrically-conductive pin 132 transfers a negative charge to the region 144 to neutralize the positive charge, as described above.

Process 900 may include additional implementations, such as any single implementation or any combination of implementations described below and/or in connection with one or more other processes described elsewhere herein.

In a first implementation, identifying the region 144 includes determining an operating parameter of a semiconductor processing tool 114 including the ESC 118, and identifying the region 144 based on a machine learning model that correlates the operating parameter of the semiconductor processing tool 114 to the region 144 of the positive charge.

In a second implementation, alone or in combination with the first implementation, process 900 includes providing, to the machine learning model, data including the operating parameter, and a magnitude of the positive charge, and using the data to update an algorithm of the machine learning model that correlates the operating parameter of the semiconductor processing tool 114 to a likelihood of an occurrence of electrical arcing between the semiconductor processing tool 114 and the semiconductor substrate 120.

In a third implementation, alone or in combination with one or more of the first and second implementations, transmitting the second signal includes transmitting positioning data that identifies a degree of warpage 602 of the semiconductor substrate 120 within the region 144 to cause the pin-positioning subsystem 152 to position the tip of the electrically-conductive pin 132 within the region 144 of the positive charge using one or more positioning adjustments that compensate for the degree of warpage 602.

In a fourth implementation, alone or in combination with one or more of the first through third implementations, transmitting the second signal includes transmitting positioning data to cause the pin-positioning subsystem 152 to reposition the tip of the electrically-conductive pin 132 from a first position corresponding to a first pin-guide 142*a* passing through the ESC 118 to a second position corresponding to a second pin-guide 152*b* passing through the ESC 118.

In a fifth implementation, alone or in combination with one or more of the first through fourth implementations, process 900 includes transmitting the positioning data to cause the pin-positioning subsystem 152 to reposition the tip of the electrically-conductive pin 132 to the second position is to cause the pin-positioning subsystem 152 to reposition the tip of the electrically-conductive pin within the region 144 of the positive charge. In some implementations, the region of positive charge is different than another region corresponding to the first position.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

Some implementations described herein provide techniques and apparatuses for a semiconductor processing tool including an ESC having a voltage-regulation system to regulate an electrical potential throughout regions of a semiconductor substrate positioned above the ESC. The voltage-regulation system may determine that an electrical potential within a region of the semiconductor substrate does not satisfy a threshold. The voltage-regulation system may, based on determining that the electrical potential throughout the region does not satisfy the threshold, position one or more electrically-conductive pins within the region. While positioned within the region, the one or more electrically-conductive pins may change the electrical potential of the region.

The voltage-regulation system ensures that the electrical potential of each region satisfies a threshold. By ensuring that the electrical potential satisfies the threshold, the voltage regulation system may reduce a likelihood of electrical arcing between the semiconductor substrate and a component of the semiconductor processing tool. In this way, damage to the semiconductor substrate may be prevented to increase a yield of semiconductor devices fabricated from the semiconductor substrate. Furthermore, damage to the semiconductor processing tool may be prevented to increase an uptime of the semiconductor processing tool and increase a throughput of semiconductor devices manufactured using the semiconductor processing tool.

As described in greater detail above, some implementations described herein provide a method. The method includes receiving, by a controller from a sensor associated with a region of a semiconductor substrate supported by an electrostatic chuck, a first signal including voltage measurement data. The method includes determining, by the controller based on the voltage measurement data, that an electrical potential of the region does not satisfy a threshold. The method includes transmitting, by the controller based on determining that the electrical potential does not satisfy the threshold, a second signal to cause a pin-positioning subsystem to position tips of a set of electrically-conductive pins within the region a third signal to activate a power supply so that the set of electrically-conductive pins transfer an electrical charge to the region so that the electrical potential of the region satisfies the threshold.

As described in greater detail above, some implementations described herein provide a method. The method includes receiving, by a controller from a sensor, a first signal including voltage measurement data. The method includes identifying, by the controller based on the voltage measurement data, a region of positive charge of a semiconductor substrate supported by an electrostatic chuck. The method includes transmitting, by the controller based on identifying the region of positive charge, a second signal including positioning data to a pin-positioning subsystem to cause the pin-positioning subsystem to position a tip of an electrically-conductive pin within the region of positive charge a third signal to adjust a setting of a power supply so that the electrically-conductive pin transfers a negative charge to the region to neutralize the positive charge.

As described in greater detail above, some implementations described herein provide a semiconductor processing tool. The semiconductor processing tool includes an electrostatic chuck including an electrode. The semiconductor processing tool includes an array of pin-guides through the electrode. The semiconductor processing tool includes a voltage-regulation system including a pin-positioning subsystem, a set of electrically-conductive pins a power supply electrically coupled with the set of electrically-conductive pins, and a controller. The controller is configured to determine that a condition associated with electrical arcing, between a topside surface of a semiconductor substrate positioned above the electrode and a component of the semiconductor processing tool, has occurred and transmit, based on determining that the condition has occurred, a first signal to cause the pin-positioning subsystem to position one or more tips of a corresponding one or more electrically-conductive pins, of the set of electrically-conductive pins, near or through exits of one or more pin-guides of the array of pin-guides. The controller is configured to transmit a second signal to cause the power supply to adjust a setting so that the one or more electrically-conductive pins transfer an electrical charge to or from the semiconductor substrate to change an electrical potential of a region of the semiconductor substrate including the topside surface.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving, by a controller from a sensor associated with a region of a semiconductor substrate supported by an electrostatic chuck, a first signal including voltage measurement data;
    determining, by the controller based on the voltage measurement data, that an electrical potential of the region does not satisfy a threshold;
    transmitting, by the controller based on determining that the electrical potential does not satisfy the threshold:
        a second signal to cause a pin-positioning subsystem to position tips of a set of electrically-conductive pins within the region; and
        a third signal to activate a power supply so that the set of electrically-conductive pins transfer an electrical charge to the region so that the electrical potential of the region satisfies the threshold.

2. The method of claim 1, wherein determining that the electrical potential does not satisfy the threshold comprises:
    determining that the electrical potential is greater than or equal to a band gap of a material of the semiconductor substrate.

3. The method of claim 2, wherein:
    the material of the semiconductor substrate includes silicon; and
    the band gap is included in a range from approximately 1.0 electron volts (eV) to approximately 1.5 eV.

4. The method of claim 1, wherein determining that the electrical potential does not satisfy the threshold comprises:
    determining that the electrical potential does not satisfy a uniformity threshold based on one or more other electrical potentials of one or more other regions of the semiconductor substrate.

5. The method of claim 1, wherein transmitting the second signal comprises:
    transmitting the second signal to cause the pin-positioning subsystem to position the tips of the set of electrically-conductive pins within the region at a distance that is in a range of greater than 0 microns (μm) to less than or equal to approximately 1 μm from a backside surface of the semiconductor substrate.

6. The method of claim 1, wherein transmitting the second signal comprises:
    transmitting data that identifies the set of electrically-conductive pins from an array of electrically-conductive pins in which the set of electrically-conductive pins is included.

7. The method of claim 1, wherein transmitting the third signal comprises:
    transmitting the third signal to activate the power supply so that the power supply provides continual power to the set of electrically-conductive pins while the semiconductor substrate is supported by the electrostatic chuck.

8. A method, comprising:
    receiving, by a controller from a sensor, a first signal including voltage measurement data;
    identifying, by the controller based on the voltage measurement data, a region of positive charge of a semiconductor substrate supported by an electrostatic chuck; and
    transmitting, by the controller based on identifying the region of positive charge:
        a second signal including positioning data to a pin-positioning subsystem to cause the pin-positioning subsystem to position a tip of an electrically-conductive pin within the region of positive charge; and
        a third signal to adjust a setting of a power supply so that the electrically-conductive pin transfers a negative charge to the region of positive charge to neutralize the region of positive charge.

9. The method of claim 8, wherein identifying the region of positive charge comprises:
    determining an operating parameter of a semiconductor processing tool including the electrostatic chuck; and
    identifying the region of positive charge based on a machine learning model that correlates the operating parameter of the semiconductor processing tool to the region of positive charge.

10. The method of claim 9, further comprising:
    providing, to the machine learning model, data comprising:
        the operating parameter; and
        a magnitude of the positive charge; and
    using the data to update an algorithm of the machine learning model that correlates the operating parameter of the semiconductor processing tool to a likelihood of an occurrence of electrical arcing between the semiconductor processing tool and the semiconductor substrate.

11. The method of claim 8, wherein transmitting the second signal comprises:
    transmitting positioning data that identifies a degree of warpage of the semiconductor substrate within the region of positive charge to cause the pin-positioning subsystem to position the tip of the electrically-conductive pin within the region of positive charge using one or more positioning adjustments that compensate for the degree of warpage.

12. The method of claim 8, wherein transmitting the second signal comprises:
transmitting positioning data to cause the pin-positioning subsystem to reposition the tip of the electrically-conductive pin from a first position corresponding to a first pin-guide passing through the electrostatic chuck to a second position corresponding to a second pin-guide passing through the electrostatic chuck.

13. The method of claim 12, wherein:
transmitting the positioning data to cause the pin-positioning subsystem to reposition the tip of the electrically-conductive pin to the second position is to cause the pin-positioning subsystem to reposition the tip of the electrically-conductive pin within the region of positive charge,
wherein the region of positive charge is different than another region corresponding to the first position.

14. A semiconductor processing tool, comprising:
an electrostatic chuck including an electrode;
an array of pin-guides through the electrode; and
a voltage-regulation system comprising:
a pin-positioning subsystem;
a set of electrically-conductive pins;
a power supply electrically coupled with the set of electrically-conductive pins; and
a controller configured to:
determine that a condition associated with electrical arcing, between a topside surface of a semiconductor substrate positioned above the electrode and a component of the semiconductor processing tool, has occurred; and
transmit, based on determining that the condition has occurred:
a first signal to cause the pin-positioning subsystem to position one or more tips of a corresponding one or more electrically-conductive pins, of the set of electrically-conductive pins, near or through exits of one or more pin-guides of the array of pin-guides; and
a second signal to cause the power supply to adjust a setting so that the one or more electrically-conductive pins transfer an electrical charge to or from the semiconductor substrate to change an electrical potential of a region of the semiconductor substrate including the topside surface.

15. The semiconductor processing tool of claim 14, wherein the set of electrically-conductive pins comprises:
at least one electrically-conductive pin comprising a carbon nanotube.

16. The semiconductor processing tool of claim 14, wherein the set of electrically-conductive pins comprises:
at least one electrically-conductive pin with a pointed tip.

17. The semiconductor processing tool of claim 14, further comprising:
a source that generates an electron beam to create the condition by changing the electrical potential of the region of the topside surface of the semiconductor substrate.

18. The semiconductor processing tool of claim 14, wherein the pin-positioning subsystem comprises:
a linear induction motor component configured to laterally reposition at least one electrically-conductive pin, of the set of electrically-conductive pins, amongst two or more pin-guides of the array of pin-guides.

19. The semiconductor processing tool of claim 14, wherein the pin-positioning subsystem comprises:
one or more components to provide independent positioning control of each electrically-conductive pin of the set of electrically-conductive pins.

20. The semiconductor processing tool of claim 14, wherein:
the controller is configured to determine that the condition associated with electrical arcing has occurred based on a machine learning model that correlates a degree of warpage of the semiconductor substrate to the condition.

* * * * *